(12) United States Patent
Tobias

(10) Patent No.: US 6,787,779 B2
(45) Date of Patent: Sep. 7, 2004

(54) APPARATUS WHEREIN IONIZING RADIATION IS GENERATED

(75) Inventor: Daniel Tobias, Oberkochen (DE)

(73) Assignee: Leo Elektronenmikroskopie GmbH, Oberkochen (DE)

( * ) Notice: Subject to any disclaimer, the term of this patent is extended or adjusted under 35 U.S.C. 154(b) by 0 days.

(21) Appl. No.: 10/314,146

(22) Filed: Dec. 9, 2002

(65) Prior Publication Data

US 2003/0116722 A1 Jun. 26, 2003

(30) Foreign Application Priority Data

Dec. 10, 2001 (DE) .......................... 101 60 402

(51) Int. Cl.[7] .............................................. G21F 15/02
(52) U.S. Cl. .............................. 250/396 R; 250/496.1; 250/310; 250/492.21; 250/307
(58) Field of Search ................... 250/396 R, 496.1, 250/310, 492.21, 307

(56) References Cited

U.S. PATENT DOCUMENTS 5,591,971 A  *  1/1997  Shahar et al. ............... 250/310
6,062,731 A      5/2000  Guzik

FOREIGN PATENT DOCUMENTS

| DE | 2845790 | 4/1979 | | |
| EP | 0 319 244 | 6/1989 | | |
| GB | 2007 480 A | * 5/1977 | ............. | G21F/1/00 |
| GB | 2 007 480 | 5/1979 | | |
| JP | 2001 273998 | 4/2002 | | |

OTHER PUBLICATIONS

Malsunaga et al., "Ion Implantation Apparatus and Insulating Busing Therefore", Pub. No. US 2002/0158213 A1, publication date: Oct. 31, 2002.*

* cited by examiner

Primary Examiner—John R. Lee
Assistant Examiner—Zia R. Hashmi
(74) Attorney, Agent, or Firm—Walter Ottesen

(57) ABSTRACT

An apparatus, which generates ionizing radiation, includes a column having a sandwich-like configuration. The column includes one or more tubes and a layer of a cured epoxy-resin mixture containing a heavy metal. The layer of epoxy-resin mixture adheres to the tube or, if the several tubes are provided, the layer adheres to the tubes. In this way, the layer defines a unit with the tube or tubes. The configuration of the apparatus provides a configuration, which is tight against exiting X-ray radiation, also in regions of breakouts and tube transitions.

51 Claims, 1 Drawing Sheet

APPARATUS WHEREIN IONIZING RADIATION IS GENERATED

FIELD OF THE INVENTION

The invention relates to an apparatus which generates ionizing radiation. Apparatus of this kind can, for example, be electron microscopes or X-ray tubes or other electron beam or particle beam apparatus.

BACKGROUND OF THE INVENTION

British patent publication 2,007,480 discloses a radiation shield for electrical equipment wherein the production of radiation is associated with high electrical gradients. In this publication, an X-ray tube or an ion accelerator are known which include a tube manufactured from lead or an epoxy-resin mixture which contains another heavy metal greatly absorbing ionizing radiation. The tube accommodates the electrodes for accelerating the particle beam. Alternatively, it is suggested that the conventional X-ray tube be surrounded by a protective shield of a corresponding epoxy-resin mixture. In this way, a reliable X-ray protection is ensured.

In a protective shield made of an epoxy-resin mixture containing lead, the same problems occur at breakthroughs as in protective shields of lead. These breakthroughs are, for example, for manipulators such as diaphragm exchangers or sample manipulators. More specifically, these same problems are that it is almost impossible to make the protective shield tight against escaping X-ray radiation in the region of a manipulator. The same applies when the tube itself, which carries the components such as the electrodes, comprises an epoxy-resin mixture containing lead. In the last case, it is noted that the epoxy-resin mixture, as a rule, does not have the stiffness and strength which are especially required in electron microscopes for the accommodation of electron-optical components.

SUMMARY OF THE INVENTION

It is an object of the invention to provide a column for an apparatus which generates ionizing radiation wherein the column can be configured tight against escaping X-ray radiation and has the required stiffness and strength for accommodating particle-optical components.

In the apparatus of the invention, ionizing radiation is generated. The apparatus includes: a tube having an inner surface defining an interior space; particle-optical components supported in the interior space by the tube; a layer of cured epoxy-resin mixture containing a heavy metal and surrounding the tube on the outside thereof; and, the layer of cured epoxy-resin mixture defining a unit adhering to the tube.

The apparatus of the invention includes a column which has a sandwich-like configuration. In a first embodiment, the tube, which supports the particle-optical components, is surrounded on the outside by a layer which comprises an epoxy-resin mixture containing a heavy metal. The tube and the layer of epoxy-mixture are glued to each other so that they define a static unit.

In an alternate embodiment, the column includes an outer tube and an inner tube disposed within the outer tube. The outer and inner tubes conjointly define an intermediate space which is filled with an epoxy-resin mixture containing a heavy metal. In this embodiment too, the epoxy resin adheres to the inner tube and/or the outer tube.

The following heavy metals, which are suitable and absorb sufficient X-ray radiation, are especially metals having an atomic number greater than 75 such as tungsten and/or lead or a chemical compound thereof such as their oxides.

The desired adhesion of the epoxy-resin mixture to the tube or to the inner and/or outer tube takes place, as a rule, automatically when the epoxy-resin mixture is poured into the intermediate space between the inner and outer tubes or the intermediate space between the tube and the casting mold, which surrounds the tube, is filled with the epoxy-resin mixture.

The hardened epoxy-resin mixture is included in the force flow between the outer tube and the inner tube; that is, the forces, which are applied by the components (mounted on the inner tube), are transmitted via the intermediate space, which is filled with the epoxy-resin mixture, to the outer tube. Likewise, in the embodiment having only one tube, the outer layer of the epoxy-resin mixture is included in the force flow because the forces, which are applied by the mounted components, are transmitted via the layer of epoxy-resin mixture to the tube. These components include manipulators or aperture changers.

Purposefully, at least one of the tubes is made of steel or a steel alloy in order to ensure the required stiffness and strength. It is, however, especially advantageous when the inner tube as well as the outer tube are made of metal, for example, steel, because the sandwich-like configuration then additionally effects an efficient shielding of electrical and magnetic fields.

The column of the apparatus can comprise a plurality of tube segments or inner tube segments and outer tube segments which are arranged one behind the other in the axial direction, that is, in the direction of the axes of the inner and outer tubes. At the connecting locations at which the tube segments abut one another, mutually engaging cutouts arid projections are provided so that the intermediate spaces, which are filled with the epoxy-resin mixture or the epoxy-resin layers of the stacked segments, overlap each other. In this way, it is possible that the entire apparatus is assembled of several premanufactured component pieces without X-ray passing holes occurring at the connecting locations, that is, locations at which X-ray radiation can escape out of the outer tube into the ambient.

The column can have one or several openings in the radial direction with a manipulator or diaphragm holder accommodated therein. The manipulator should have a support structure which is likewise provided with a layer of an epoxy-resin mixture containing a heavy metal. The thickness of the layer is so selected that the layer of the epoxy-resin mixture overlaps the edge of the breakout through the tube.

The support structure of the manipulator or of the aperture holder is configured to be stepped or conical with the transverse dimension increasing toward the outside. In this way, it is easier to achieve that the epoxy-resin mixture of the manipulator or of the aperture diaphragm and the epoxy-resin mixture of the column overlap at least at a transition region so that a configuration is ensured which is tight against X-ray radiation also at the breakout for the manipulator or diaphragm holder.

Components such as operator-controlled knobs are arranged in the radial direction of the column and are on the manipulator or diaphragm holder. It is further advantageous that these components are filled out with an epoxy-resin mixture having a heavy metal.

BRIEF DESCRIPTION OF THE DRAWINGS

The invention will now be described with reference to the single figure (FIG. 1) of the drawing.

DESCRIPTION OF THE PREFERRED EMBODIMENTS OF THE INVENTION

Figure 1:
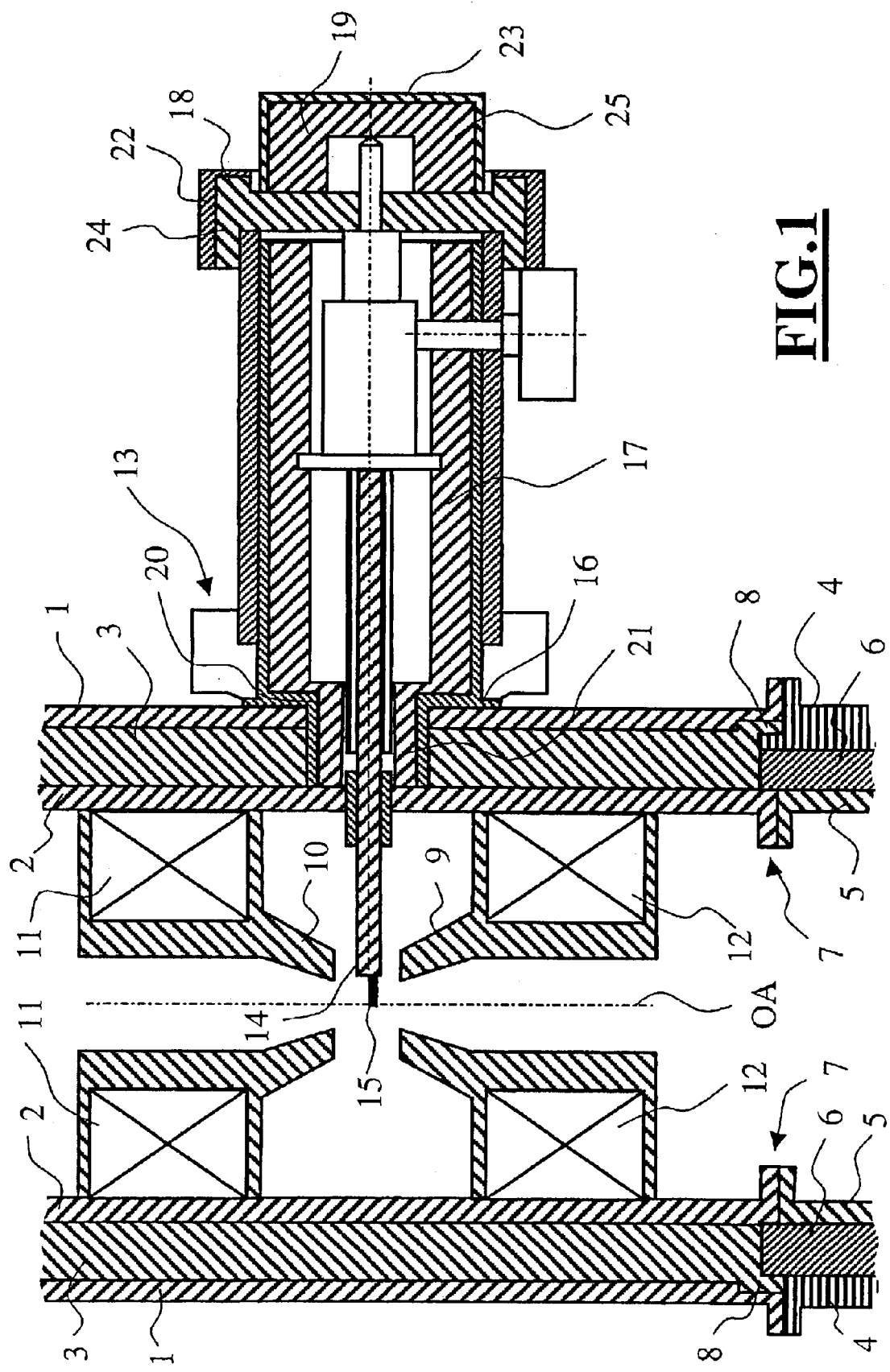
FIG. 1 shows a detail of an apparatus in the region of a manipulator. The apparatus has a column having a sandwich-like configuration.

In FIG. 1, the configuration of a column of an electron microscope is shown in the region of the objective lens. The total apparatus has a configuration known per se and has a particle-beam generator and a multi-stage illuminating system having two or three magnetic lenses above the detail shown in FIG. 1 and has a multi-stage imaging system with three or more magnetic lenses below the detail shown. The magnetic lenses above the detail shown are arranged along the optical axis one behind the other and the magnetic lenses below the detail shown are also arranged one behind the other.

The column includes an outer tube 1 and an inner tube 2 arranged concentrically within the outer tube. The outer tube 1 and the inner tube 2 are mounted concentrically to the optical axis OA of the electron microscope.

The intermediate space between the inner tube 2 and the outer tube 1 is filled up with an epoxy-resin mixture 3. The epoxy-resin mixture 3 contains large portions of a heavy metal such as lead or lead oxide. The component of the heavy metal is so selected that the absorption of the epoxy-resin mixture 3 for the X-ray radiation corresponds to 50 to 75% of the radiation absorption of the pure heavy metal.

A filling out of the intermediate space takes place by pouring, that is, it is filled with a liquid epoxy-resin mixture after the inner tube is mounted in the outer tube and is held in the relative position. To manufacture the epoxy-resin mixture, it is practical to first activate the epoxy resin with the starter and to mix the activated epoxy resin, which is still liquid, with the heavy metal particles. In this way, unwanted chemical reactions between the starter and the heavy metal particles are avoided.

The filling up of the intermediate space with epoxy-resin mixture leads, after curing of the epoxy-resin mixture, to the condition that the outer tube 1 is glued to the inner tube 2 by the epoxy-resin mixture.

The entire column comprises several column pieces arranged one behind the other in the axial direction, that is, in the direction of the optical axis OA. For this purpose, and as shown in FIG. 1, an additional column piece configured in the same way is mounted at the lower end of the column piece having the outer tube 1 and the inner tube 2. The additional column piece has an additional outer tube piece 4 and a further inner tube piece 5. In this additional column piece 2, the intermediate space 6 between the additional outer tube piece 4 and the additional inner tube piece 5 is also filled with an epoxy-resin mixture containing a heavy metal.

The two column pieces conjointly define a transition region 7. At this transition region 7, the connection between the two columns includes a toothed configuration. For this purpose, and as shown in FIG. 1, the one inner tube 2 is shortened relative to the corresponding outer tube 1 and the complementary inner tube piece 5 is lengthened in correspondence to the corresponding outer tube piece 4. With suitable machining of the epoxy-resin mixture of the one column piece, the condition is achieved that, on one column piece, a projection 8 remains which overlaps the connecting location. In this way, it is ensured that also at such a connecting location 7, no X-ray radiation can escape which has not been attenuated. The above-mentioned machining can be by turning or milling.

The column portions can be connected to each other in the usual manner, for example, they can be connected at the indicated flanges with threaded fasteners.

In the embodiment shown, the outer tube 1 has a cutout in order to ensure an adequate thickness of the remaining projection. Alternatively, it is also possible in the overlapping region to process the epoxy-resin mixture of the two column pieces to be connected to have a step-shaped configuration so that the desired toothed configuration is ensured in the transition region 7.

The required electron-optical components are accommodated on the inner tube 2. In the detail shown in FIG. 1. the components are the objective lens of a transmission electron microscope having the two pole shoe pairs (9, 10) and the magnetic field coils (11, 12). The connection between these components with the inner tube can take place, as usual, via flanges and stops (not shown) using threaded fasteners.

A manipulator 13 is accommodated on the outer tube 1 at the elevation of the pole shoe gap. The manipulator functions to move and position the object, which is to be investigated, in the focal plane of the objective lens. The manipulator includes a hollow metal support structure 16 of, for example, aluminum or steel. The support structure 16 is stepped as shown in cross section in the region of the receptacle on the outer tube 1. The support structure is configured to be stepped outwardly with increasing dimensions, for example, with an increasing diameter. The outer diameter of the support structure includes a step 20. The interior space of the support structure 16 is, in turn, filled with an epoxy-resin mixture 17 containing a heavy metal. Because of the stepped configuration of the support structure 16, its tapered part 21 can be seated in the breakout of the column. At the same time, because of the stepped configuration, the hole in the outer tube 1 is overlappingly covered by the thickened portion of the manipulator and in dependence upon the thickness of the support structure itself so that the epoxy-resin mixture 17 of the manipulator covers the breakout through the column. In this way, it is ensured that no X-ray radiation can escape from the column to the outside and the ambient in the region of the manipulator breakout.

The inner tube 2 defines the outer vacuum tube of the apparatus so that the epoxy-resin mixture does not border on the vacuum. A pollution of the vacuum by the substances degassing from the epoxy resin is precluded in this way. Correspondingly, the vacuum sealing of the manipulator at the inner tube 2 takes place so that the vacuum does not border on the epoxy-resin mixture also in the region of the breakout for the manipulator.

So that the manipulator itself is tight for X-ray radiation, the drive knobs (18, 19) of the manipulator are configured from respective carrier structures (22, 23). Each of the carrier structures (22, 23) is filled with an epoxy-resin mixture containing a heavy metal. The dimensioning of the drive knobs is so selected that the hollow space in the interior of the support structure is at least spatially covered by the drive knob so that X-ray radiation, which escapes through the breakout, is either absorbed in the epoxy-resin mixture of the manipulator walls or in the epoxy-resin mixture of the drive knobs. The hollow space in the interior of the support structure is needed for the manipulator mechanism.

The manufacture of a manipulator can take place in that the support structure is first filled out with the epoxy-resin mixture and, thereafter, the recess, which is required for accommodating the manipulator mechanism, is machined into the hardened epoxy-resin mixture by a suitable machining process such as boring, turning and milling. Thereafter, the manipulator mechanism is seated in the recess.

The manipulator itself includes a rod 14 which reaches close to the optical axis OA and the tip thereof carries the receptacle 15 for the object to be investigated. The position of the object relative to the optical axis can be varied by actuating the drive knob 19.

A diaphragm holder can be configured in the same manner as the manipulator described above. The manipulator mechanism is then correspondingly simplified.

As an alternative to the embodiment shown in FIG. 1, it is also possible to do without the outer tube 1. In this case, the epoxy-resin layer forms the outer tube. Such an embodiment can be made in that a tube 2, which supports the particle-optical components, is placed in a casting mold and the intermediate space which then results is filled with liquid epoxy resin. The casting mold then is removed. The casting mold is provided with a separating layer suitable for removing the mold preventing the adherence of the epoxy-resin mixture to the casting mold.

Likewise, for the manipulator, it is possible to apply the epoxy-resin layer to the support structure from the outside. In this case, one saves machining the hollow space required for the manipulator mechanism. It is practical to dimension the diameter of the support structure so that the hollow space is sufficient within the support structure for accommodating the manipulator mechanism.

The two last-mentioned variations have, however, the disadvantage that the epoxy-resin layer, which contains the heavy metal, is not enclosed and the operator can therefore come into contact with the bonded heavy metal.

The thickness of the layers of the epoxy-resin mixture are, in each case, selected in dependence upon the energy and intensity of the occurring X-ray radiation and of the heavy metal portion in the epoxy-resin mixture so that the exiting X-ray radiation is so greatly absorbed within the epoxy-resin mixture that health risks are precluded.

It is understood that the foregoing description is that of the preferred embodiments of the invention and that various changes and modifications may be made thereto without departing from the spirit and scope of the invention as defined in the appended claims.

What is claimed is:

1. An apparatus wherein ionizing radiation is generated, the apparatus comprising:
   a tube having an inner surface defining an interior space;
   particle-optical components supported in said interior space by said tube;
   a layer of cured epoxy-resin mixture containing a heavy metal and surrounding said tube on the outside thereof; and,
   said layer of cured epoxy-resin mixture defining a unit adhering to said tube.

2. The apparatus of claim 1, wherein said heavy metal is lead.

3. The apparatus of claim 1, wherein said tube is made of steel.

4. The apparatus of claim 1, wherein said tube and said layer define a first tube segment; and, said apparatus further comprises: a second tube segment likewise including a tube and a layer of said cured epoxy-resin mixture; said first and second tube segments conjointly defining a common longitudinal axis and a connecting interface therebetween; and, said connecting interface including mutually engaging projections and cutouts so that said layers of epoxy-resin mixture overlap.

5. The apparatus of claim 1, wherein said tube and said layer have an opening formed therein in a radial direction; and, said apparatus further comprises a manipulator accommodated in said opening; and, said manipulator including a support structure defining an interior and a layer disposed in said interior of said support structure; and, said layer being of an epoxy-resin mixture containing a heavy metal.

6. The apparatus of claim 5, wherein said opening has an edge; and, said layer has a thickness sufficient so as to permit said layer to cover said opening.

7. The apparatus of claim 6, wherein said manipulator has an end element and said end element has a layer of epoxy-resin mixture disposed thereon.

8. The apparatus of claim 7, wherein said end element is an operator-controlled element.

9. The apparatus of claim 1, wherein said tube and said layer have an opening formed therein in a radial direction; and, said apparatus further comprises a manipulator accommodated in said opening; and, said manipulator including a support structure; a layer surrounding said support structure on the outside thereof; and, said layer being of an epoxy-resin mixture containing a heavy metal.

10. The apparatus of claim 9, wherein said opening has an edge; and, said layer has a thickness sufficient so as to permit said layer to cover said opening.

11. The apparatus of claim 10, wherein said manipulator has an end element and said end element has a layer of epoxy-resin mixture disposed thereon.

12. The apparatus of claim 11, wherein said end element is an operator-controlled element.

13. An apparatus wherein ionizing radiation is generated, the apparatus comprising:
   an outer tube;
   an inner tube mounted within said outer tube;
   said outer and inner tubes conjointly defining an annular space therebetween;
   an epoxy-resin mixture filling out said annular space and said epoxy-resin mixture containing a heavy metal; and,
   said epoxy-resin mixture adhering to at least one of said outer and inner tubes.

14. The apparatus of claim 13, wherein said heavy metal is lead.

15. The apparatus of claim 13, wherein said at least one of said outer and inner tubes is made of steel.

16. The apparatus of claim 13, wherein said inner tube has an inner surface defining an interior space; and, said apparatus further comprising particle-optical components supported in said interior space by said inner tube.

17. The apparatus of claim 16, wherein said particle-optical components include at least one of lenses and electrodes.

18. The apparatus of claim 13, wherein said inner and outer tubes define a first tube segment; and, said apparatus further comprises: a second tube segment likewise including inner and outer tubes and cured epoxy-resin mixture disposed therebetween; said first end second tube segments conjointly defining a common longitudinal axis and a connecting interface therebetween; and, said connecting interface including mutually engaging projections and cutouts so that epoxy-resin mixtures overlap.

19. The apparatus of claim 13, wherein said inner and outer tubes and said epoxy-resin mixture therebetween conjointly define an opening formed therein in a radial direction; and, said apparatus further comprises a manipulator accommodated in said opening; and, said manipulator including a support structure defining an interior and a layer disposed in said interior of said support structure; and, said layer being of an epoxy-resin mixture containing a heavy metal.

20. The apparatus of claim 19, wherein said opening has an edge; and, said layer has a thickness sufficient so as to permit said layer to cover said opening.

21. The apparatus of claim 20, wherein said manipulator has an end element and said end element has a layer of epoxy-resin mixture disposed thereon.

22. The apparatus of claim 21, wherein said end element is an operator-controlled element.

23. The apparatus of claim 13, wherein said tube and said layer have an opening formed therein in a radial direction; and, said apparatus further comprises a manipulator accommodated in said opening; and, said manipulator including a support structure; a layer surrounding said support structure on the outside thereof; and, said layer being of an epoxy-resin mixture containing a heavy metal.

24. The apparatus of claim 23, wherein said opening has an edge; and, said layer has a thickness sufficient so as to permit said layer to cover said opening.

25. The apparatus of claim 24, wherein said manipulator has an end element and said end element has a layer of epoxy-resin mixture disposed thereon.

26. The apparatus of claim 25, wherein said end element is an operator-controlled element.

27. A manipulator for a particle-optical apparatus including an electron microscope, the manipulator comprising: a support structure; a layer of an epoxy-resin mixture disposed on said support structure; and, said epoxy-resin mixture containing a heavy metal.

28. A manipulator for a particle-optical apparatus including an electron microscope, the manipulator comprising: a support structure; a layer of an epoxy-resin mixture disposed on said support structure; said epoxy-resin mixture containing a heavy metal; and, said layer of said epoxy-resin mixture adhering to said support structure.

29. An apparatus wherein ionizing radiation is generated, the apparatus comprising:

a tube made of steel and having an inner surface defining an interior space;

particle-optical components supported in said interior space by said tube;

a layer of cured epoxy-resin mixture containing a heavy metal and surrounding said tube on the outside thereof; and, said layer of cured epoxy-resin mixture defining a unit adhering to said tube.

30. The apparatus of claim 29, wherein said tube and said layer define a first tube segment; and, said apparatus further comprise: a second tube segment likewise including a tube and a layer of said cured epoxy-resin mixture; said first and second tube segments conjointly defining a common longitudinal axis and a connecting interface therebetween; and, said connecting interface including mutually engaging projections and cutouts so that said layers of epoxy-resin mixture overlap.

31. The apparatus of claim 29, wherein said tube and said layer have an opening formed therein in a radial direction; and, said apparatus further comprises a manipulator accommodated in said opening; and, said manipulator including a support structure defining an interior and a layer disposed in said interior of said support structure; and, said layer being of an epoxy-resin mixture containing a heavy metal.

32. The apparatus of claim 31, wherein said opening has an edge; and, said layer has a thickness sufficient so as to permit said layer to cover said opening.

33. The apparatus of claim 32, wherein said manipulator has an end element and said end element has a layer of epoxy-resin mixture disposed thereon.

34. The apparatus of claim 33, wherein said end element is an operator-controlled element.

35. The apparatus of claim 29, wherein said tube and said layer have an opening formed therein in a radial direction; and, said apparatus further comprises a manipulator accommodated in said opening; and, said manipulator including a support structure; a layer surrounding said support structure on the outside thereof; and, said layer being of an epoxy-resin mixture containing a heavy metal.

36. The apparatus of claim 35, wherein said opening has an edge; and, said layer has a thickness sufficient so as to permit said layer to cover said opening.

37. The apparatus of claim 36, wherein said manipulator has an end element and said end element has a layer of epoxy-resin mixture disposed thereon.

38. The apparatus of claim 37, wherein said end element is an operator-controlled element.

39. An apparatus wherein ionizing radiation is generated, the apparatus comprising:

an outer tube made of steel;

an inner tube made of steel and mounted within said outer tube;

said outer and inner tubes conjointly defining an annular space therebetween;

an epoxy-resin mixture filling out said annular space and said epoxy-resin mixture containing a heavy metal; and, said epoxy-resin mixture adhering to at least one of said outer and inner tubes.

40. The apparatus of claim 39, wherein said heavy metal is lead.

41. The apparatus of claim 39, wherein said inner tube has an inner surface defining an interior space; and, said apparatus further comprising particle-optical components supported in said interior space by said inner tube.

42. The apparatus of claim 41, wherein said particle-optical components include at least one of lenses and electrodes.

43. The apparatus of claim 39, wherein said inner and outer tubes define a first tube segment; and, said apparatus further comprises: a second tube segment likewise including inner and outer tubes and cured epoxy-resin mixture disposed therebetween; said first and second tube segments conjointly defining a common longitudinal axis and a connecting interface therebetween; and, said connecting interface including mutually engaging projections and cutouts so that epoxy-resin mixtures overlap.

44. The apparatus of claim 39, wherein said inner and outer tubes and said epoxy-resin mixture therebetween conjointly define an opening formed therein in a radial direction; and, said apparatus further comprises a manipulator accommodated in said opening; and, said manipulator including a support structure defining an interior and a layer disposed in said interior of said support structure; and, said layer being of an epoxy-resin mixture containing a heavy metal.

45. The apparatus of claim 44, wherein said opening has an edge; and, said layer has a thickness sufficient so as to permit said layer to cover said opening.

46. The apparatus of claim 45, wherein said manipulator has an end element and said end element has a layer of epoxy-resin mixture disposed thereon.

47. The apparatus of claim 46, wherein said end element is an operator-controlled element.

48. The apparatus of claim 39, wherein said tube and said layer have an opening formed therein in a radial direction; and, said apparatus further comprises a manipulator accommodated in said opening; and, said manipulator including a support structure; a layer surrounding said support structure on the outside thereof; and, said layer being of an epoxy-resin mixture containing a heavy metal.

49. The apparatus of claim 48, wherein said opening has an edge; and, said layer has a thickness sufficient so as to permit said layer to cover said opening.

50. The apparatus of claim 49, wherein said manipulator has an end element and said end element has a layer of epoxy-resin mixture disposed thereon.

51. The apparatus of claim 50, wherein said end element is an operator-controlled element.

* * * * *